United States Patent [19]

Kitanaka et al.

[11] 4,389,453

[45] Jun. 21, 1983

[54] REINFORCED POLYPHENYLENE SULFIDE MOLDED BOARD, PRINTED CIRCUIT BOARD INCLUDING THIS MOLDED BOARD AND PROCESS FOR PREPARATION THEREOF

[75] Inventors: Minoru Kitanaka, Nagoya; Yukichi Deguchi, Otsu, both of Japan

[73] Assignee: Toray Industries, Inc., Japan

[21] Appl. No.: 386,054

[22] Filed: Jun. 7, 1982

[51] Int. Cl.³ .............................................. B32B 5/16
[52] U.S. Cl. ................................. 428/240; 156/242; 156/243; 156/245; 156/283; 156/306.6; 428/253; 428/281; 428/282; 428/283; 428/284; 428/285; 428/286; 428/288; 428/297; 428/402; 428/901; 264/257; 264/258; 428/298
[58] Field of Search ............... 428/224, 240, 268, 273, 428/285, 286, 290, 901, 280, 281, 282, 151, 253, 282, 288, 297, 298, 283, 284, 402; 156/242, 243, 245, 283, 306.6; 264/257, 258, 259, 272.17, 275

[56] References Cited

FOREIGN PATENT DOCUMENTS 54-85380  7/1979  Japan .......................................... 1/2

*Primary Examiner*—James J. Bell
*Attorney, Agent, or Firm*—Austin R. Miller

[57] ABSTRACT

A polyphenylene sulfide (PPS) molded board reinforced with 15–85 wt. % of glass fibers (GF) having a length of at least 5 mm is provided. The molded board is useful as an insulating substrate of a printed circuit board. The printed circuit board is prepared by compressing under heating a mixture or laminate of PPS and GF to form a composite molded board and, at or after the compression step, bonding a metallic foil to a surface the composite molded board. The printed circuit board is excellent in mechanical properties such as impact resistance, thermal properties such as heat distortion temperature and solder resistance, and adhesion between the insulating substrate and the metallic foil.

24 Claims, No Drawings

REINFORCED POLYPHENYLENE SULFIDE MOLDED BOARD, PRINTED CIRCUIT BOARD INCLUDING THIS MOLDED BOARD AND PROCESS FOR PREPARATION THEREOF

BACKGROUND OF THE INVENTION (1) Field of the Invention

This invention relates to a reinforced polyphenylene sulfide (hereinafter referred to as "PPS" for brevity) molded board which is excellent in mechanical properties, such as impact resistance, and thermal properties, such as heat distortion temperature and solder resistance, and which provides a very strong adhesion to a metallic foil even without using an adhesive. This invention also relates to a printed circuit board comprising such a reinforced PPS molded board as an insulating substrate, and a process for preparing this printed circuit board with ease and at low cost.

(2) Description of the Prior Art

So-called printed circuit boards comprising an insulating substrate and a conductor composed of a metallic foil such as a copper foil, which is flatly bonded onto the substrate, are used in large quantities for electric circuits in various household electric appliances, electronic computers, communication facilities and various meters and instruments.

As the insulating substrate for a printed circuit board, there has heretofore been used a composite sheet formed by combining a thermosetting resin such as an epoxy resin, a phenol resin or an unsaturated polyester resin with a base sheet composed of paper, glass fibers or synthetic fibers. These composite sheets are prepared by a process wherein a base sheet composed of paper, glass fibers or synthetic fibers is coated or impregnated with a resin solution, generally termed a "varnish", which is formed by dissolving a thermosetting resin in a solvent; the coated or impregnated base sheet is heated in a drier to vaporize the solvent in the varnish and remove the solvent and to effect polymerization of the resin to form a prepreg of the so-called B-stage; a predetermined number of the so-formed prepregs are superposed upon another and compressed under heating to cure the resin. However, in this process, since it is necessary to remove the solvent from the varnish applied to the base sheet, large expenses are required for recovery and treatment of the solvent. Furthermore, the solvent is scattered in the open air and the working environment is drastically polluted. Moreover, a long time is required for curing the resin. Accordingly, this process is disadvantageous from an economical viewpoint.

It is known that a thermoplastic resin such as polyethylene, polytetrafluoroethylene or polyphenylene oxide may also be used as the insulating substrate for a printed circuit board. However, none of these thermoplastic resins can provide printed circuit boards which are satisfactorily balanced among the thermal properties, the mechanical properties, the chemical resistance and the manufacturing costs.

Japanese Patent Laid-open Application (JP-A) No. 85,380/79 proposes a printed circuit board comprising as an insulating substrate a molded board comprising PPS, which is excellent by itself in heat resistance, chemical resistance, electric properties and flame retardancy, and glass fibers (hereinafter referred to as "GF" for brevity) having a length smaller than 3 mm, and a metallic foil bonded to said substrate through an epoxy type adhesive. However, this printed circuit board is poor in mechanical properties and is especially poor in resistance to the soldering operation which is indispensable for processing and attachment of the printed circuit board, that is, the solder resistance. Moreover, the process for preparing this printed circuit board involves various complicated steps such as the steps of mixing PPS with GF, the melt-kneading step, the injection molding step, the adhesive-coating step and the metal foil-bonding step, and the obtained printed circuit board is very expensive.

SUMMARY OF THE INVENTION

It is therefore a primary object of the present invention to provide a printed circuit board which has well-balanced mechanical properties, such as impact resistance, thermal properties, such as heat distortion temperature and solder resistance, chemical resistance, electric properties, flame retardancy and the bonding strength between the substrate and metallic foil.

Another object of the present invention is to provide a process for preparing the above-mentioned excellent printed circuit board at low costs by simplified process steps.

Other objects and advantages of the present invention will be apparent from the following description.

In accordance with one fundamental aspect of the present invention, there is provided a reinforced polyphenylene sulfide molded board comprising, based on the weight of the molded board, 20 to 85% by weight of polyphenylene sulfide and 15 to 80% by weight of glass fibers having a length of at least 5 mm.

In accordance with another aspect of the present invention, there is provided a printed circuit board comprising as an insulating substrate a glass fiber-reinforced polyphenylene sulfide molded board comprising, based on the weight of the molded board, 20 to 85% by weight of polyphenylene sulfide having a degree of crystallinity of at least 40% and 15 to 80% by weight of glass fibers having a length of at least 5 mm, and a metallic foil bonded to the surface of said insulating substrate.

In accordance with still another aspect of the present invention, there is provided a process for the preparation of printed circuit boards, which comprises compressing under heating a mixture or laminate comprising 20 to 85% by weight of polyphenylene sulfide and 15 to 80% by weight of glass fibers having a length of at least 5 mm to form a composite molded board, and, at or after the compression step, bonding a metallic foil to the surface of the molded board.

DETAILED DESCRIPTION OF THE PREFERRED EMBODIMENTS

Since the printed circuit board of the present invention is prepared from PPS and GF without subjecting the mixture of PPS and GF to the melt-kneading step, the process steps can be simplified, and since GF contained in the obtained printed circuit board retains a length of at least 5 mm, the reinforcing efficiency is high and the mechanical properties, such as impact resistance are very high. Furthermore, the printed circuit board of the present invention is excellent in solder resistance over the conventional printed circuit board comprising as an insulating substrate a PPS molded board comprising GF having a length smaller than 3 mm, and therefore, an effect of providing a high adhesion between the substrate and metallic foil without using an adhesive can be attained according to the present invention.

PPS that is used in the present invention is a polymer comprising at least 90 mol %, preferably at least 95 mol %, of repeating units represented by the structural formula

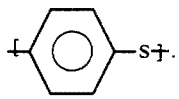

If the content of the above repeating units (units of phenylene sulfide of the para-linkage) is lower than 90 mol %, the crystallinity of the polymer is insufficient and the rigidity and heat distortion temperature are reduced. PPS that is used in the present invention may comprise up to 10 mol % of repeating units represented by the structural formula:

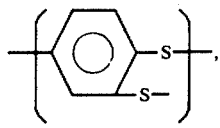

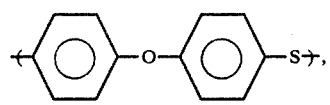

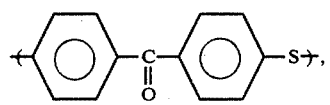

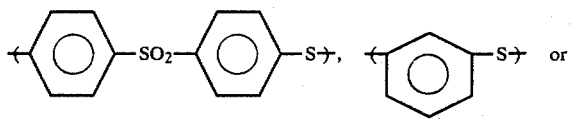

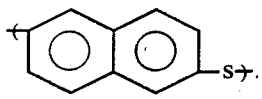

It is preferred that PPS used in the present invention should have a melt viscosity of 50 to 50,000 poises, especially 100 to 5,000 poises, as determined at a temperature of 300° C. and an apparent shear rate of 200 sec$^{-1}$. If the melt viscosity is lower than 50 poises, satisfactory mechanical strength and impact resistance cannot be obtained. If the melt viscosity is higher than 50,000 poises, when GF is combined with PPS, voids among GF are not sufficiently filled with PPS and attainment of the desired mechanical strength cannot be expected.

Ordinary additives such as an antioxidant, a heat stabilizer, a lubricant, a crystal nucleating agent, an ultraviolet absorber, a coloring agent, a filler and a parting agent may be incorporated into PPS used in the present invention. Furthermore, a small amount of other polymer may be blended in PPS used in the present invention, so far as attainment of the objects of the present invention is not inhibited.

The form of GF used in the present invention is not particularly limited, so far as the length of GF is at least 5 mm. For example, GF may be used in the form of a chopped fiber, a chopped fiber mat, a continuous filament mat, a woven fabric, a knitted fabric or a combination of two or more of them. In the present invention, it is preferred that GF be used in the form of a mat or a fabric such as a woven or knitted fabric.

Factors important for obtaining a printed circuit board having good heat resistance, mechanical strength and bonding strength are the length and content of GF contained in the insulating substrate and the degree of crystallinity of PPS. GF having a length of at least 5 mm should be contained in an amount of 15 to 80% by weight, preferably 20 to 75% by weight. If the length of GF is smaller than 5 mm or the content of GF is lower than 15% by weight, no satisfactory mechanical properties can be obtained. If the content is higher than 80% by weight, the mechanical properties are rather reduced.

It is preferred that the degree of crystallinity of the PPS matrix in the insulating substrate be at least 40%, especially at least 50%. This degree of crystallinity is important in the case where the glass fiber-reinforced PPS molded board is used as an insulating substrate of a printed circuit board. This is because, if the degree of crystallinity is lower than 40%, deformation is large under heating and the heat resistance is insufficient. It is preferred that the degree of crystallinity be not more than about 75%. If the degree of crystallinity exceeds about 75%, a substantially long period of time is necessary for crystallization.

Incidentally, the degree of crystallinity herein referred to is determined according to the X-ray diffraction method (see Masao Kakudo, "Polymer X-Ray Diffractometry", pages 262–265). More specifically, in the line profile of X-ray diffraction in the range of from $2\theta=14°$ to $2\theta=24°$, a base line is drawn by connecting the diffraction intensity at $2\theta=14°$ to the diffraction intensity at $2\theta=24°$ and a gentle curve is drawn along the skirt portion of the line profile of X-ray diffraction, in order to divide the diffraction intensity into crystalline diffraction and amorphous halo. Since the intensity of amorphous halo corresponding to GF in the sample is much smaller than the intensity of amorphous PPS halo, the amorphous halo from GF is neglected and correction is not conducted.

When a customary method wherein a chopped fiber of GF and powdery or granular PPS is melt-extruded by an extruder or a method wherein pellets prepared by the above method or a mixture of a chopped fiber of GF and PPS is injection molded is adopted as means for obtaining a reinforced PPS molded board (insulating substrate) or a printed circuit board of the present invention, the length of GF is shortened to less than 3 mm, particularly less than 0.5 mm, by a shearing force imposed at the melt-kneading or injection molding step, and therefore, the resulting molded board becomes poor in impact strength, and comes to have anisotropic characteristics and readily warps.

Accordingly, as means for obtaining a reinforced PPS molded board or printed circuit board of the present invention in which the length of GF is at least 5 mm, preferably 1.0 cm, and high impact resistance is maintained, there should be adopted a method in which integration of PPS with GF is accomplished only by compression under heating while avoiding application of a shearing force. Specifically, the following five methods (1) through (5) can be mentioned.

(1) A chopped glass fiber having a length of at least 5 mm, preferably a chopped glass fiber to which a sizing agent has not been applied, is mixed with powdery PPS at a predetermined ratio; the mixture is blended by a Henschel mixer under conditions not causing cutting of GF, for example, at a number of revolution of 500 to 2,000 rpm for about 5 to about 20 minutes; the resulting fibrous mixture is compression-molded in a mold heated at a temperature higher than the melting point of PPS, ordinarily at 290° to 330° C.; and then, the molded article is cooled to a temperature lower than the melting point of PPS ordinarily to 150° to 200° C., and then is withdrawn.

(2) A chopped glass fiber similar to that mentioned above with respect to method (1) is interposed between PPS sheets, and the assembly is compression-molded in the same manner as in method (1).

(3) A predetermined amount of powdery PPS is scattered onto a GF fabric such as a chopped glass fiber mat, a continuous glass filament mat or a woven or knitted fabric of GF, and the fabric having the PPS powder is compression-molded in same manner as in the method (1).

(4) One or more GF fabrics similar to those used in method (3) and one or more PPS sheets are alternately superposed upon another, and the assembly is compression-molded in same manner as in method (1).

(5) A mixture or assembly of PPS with GF, similar to those which are mentioned in method (1), (2), (3) or (4) is introduced between a pair of metal belts where the mixture or assembly is continuously heated and cooled under pressure to form a composite molded board.

Among these methods (1) through (5), methods (3), (4) and (5) are preferably from the viewpoint of process efficiency, and method (5) is especially preferable because a high manufacturing efficiency can be attained.

In method (5), the heating temperature is ordinarily 290° to 330° C., and the pressure is 10 to 150 kg/cm$^2$. The cooling temperature is in the range of from about 120° C. at which PPS can be crystallized with a degree of crystallinity of at least 40%, to the melting point (about 285° C.), preferably in the range from 140° to 240° C.

The foregoing methods are advantageous over the conventional method using a varnish of an epoxy resin or phenolic resin, because a good insulating substrate can be obtained only by melting PPS, impregnating GF with the molten PPS and then cooling the impregnated GF under pressure and the operation efficiency is increased since the steps of recovering and treating the solvent and curing the resin become unnecessary.

The thickness of the molded board to be used as an insulating substrate in the present invention is not particularly critical, but ordinarily, the thickness is adjusted to 0.05 to 5.0 mm. If desired, in order to increase the thickness of the molded board, a sheet composed of another resin may be laminated on one surface of the molded board according to the present invention.

The heat distortion temperature of the so-obtained molded board as determined under a load of 18.6 kg/cm$^2$ according to the method of ASTM D-648 is extremely high and is in the range of from 260° to 285° C., and the molded board is excellent not only in heat resistance and solder resistance but also in mechanical strength. Accordingly, the molded board is especially useful as an insulating substrate for a printed circuit board.

The molded board of the present invention can be shaped into molded articles, such as a tray, a cup and a dome, by a process wherein the molded board is heated at a temperature higher than the melting point of PPS, and then, compression-molded in a mold maintained at a temperature below the melting point of PPS.

As the metallic foil to be bonded to the insulating substrate for the preparation of the printed circuit board of the present invention, there can be mentioned copper foil, aluminum foil and silver foil. Of these, copper foil is especially preferred.

Bonding of the metallic foil to the insulating substrate can be accomplished simultaneously with the integration of PPS with GF in any of the foregoing methods (1) through (5) or at any optional stage after the integration. In view of the simplicity of the process, it is preferred that the bonding be carried out simultaneously with the integration. The means for bonding the metallic foil to the insulating substrate to form a conductor layer is not particularly critical. For example, there can be adopted a so-called substractive method wherein a metallic foil is bonded to the surface of the insulating substrate and then, the metallic foil is pattern-etched, an additive method wherein copper or the like is deposited in the form of a pattern on the insulating substrate, and a stamping foil method wherein a copper foil or the like stamped in the form of a pattern is bonded to the insulating substrate.

When the metallic foil is bonded to the insulating substrate in the present invention, good adhesion can be obtained even without using an adhesive. However, if an epoxy type adhesive, a silane type adhesive, an epoxy-silane type adhesive or an isocyanate type adhesive is used according to need, a further improved adhesion can be obtained.

The printed circuit board prepared according to the simplified process of the present invention has excellent thermal and mechanical properties and good solder resistance, and therefore, application of this printed circuit board to electric and electronic industries is very promising.

The present invention will now be described in detail with reference to the following Examples that by no means limit the scope of the invention. In the Examples, parts are by weight.

EXAMPLE 1

An autoclave was charged with 32.6 kg (250 mols; 40% by weight of water of crystallization contained) of sodium sulfide, 100 g of sodium hydroxide, 36.1 kg (250 mols) of sodium benzoate and 79.2 kg of N-methyl-2-pyrrolidone (hereinafter referred to as "NMP"), and the temperature was gradually elevated to 205° C. to distill off 7.0 l of a distillate containing 6.9 kg of water. To the residual mixture were added 37.5 kg (255 mols) of 1,4-dichlorobenzene and 20.0 kg of NMP, and the mixture was maintained at 265° C. for 4 hours. The reaction product was washed with hot water 8 times and dried at 80° C. for 24 hours in a vacuum drier to obtain 21.1 kg of powdery, highly polymeric PPS having a melt viscosity of 2,900 poises.

A sheet having a thickness of 0.7 mm was prepared from this PPS by extrusion. Then, two of the so-prepared sheets and two continuous glass filament mats ("M9600" supplied by Asahi Fiber Glass K.K.; basis weight=600 g/m$^2$) were alternately superposed upon each other and the assembly was supplied into a flat die mold placed in a heating press maintained at 330° C.

where the assembly was pressed for 3 minutes under a pressure of 5 kg/cm². The mold was transferred into a cooling press maintained at 150° C., and the assembly was cooled for 5 minutes under a pressure of 35 kg/cm² to obtain a continuous glass filament-reinforced PPS molded board (A) having a thickness of 1.6 mm.

The powdery PPS obtained according to the above-mentioned method and a chopped glass fiber having a length of 3, 6 or 15 mm ("CS03MA411", "CS06MA411" or "CS15MA411" supplied by Asahi Fiber Glass K.K.) were mixed for 20 minutes in a Henschel mixer so that the amount of the glass fiber incorporated was 40% by weight, to obtain a fibrous mixture comprising the powdery PPS and chopped glass fiber. The mixture was supplied to a heating press where the mixture was press-molded, and then, cooled under the same conditions as described above to obtain a molded board (B), (C) or (D) having a thickness of 1.6 mm.

Separately, an adhesive comprising 70 parts of a polyester-amide resin consisting of 40% by weight of butylene terephthalate units, 27% by weight of butylene isophthalate units and 33% by weight of dodecanamide as described above. The properties were determined to obtain results shown in Table 1.

The properties shown in Table 1, except the solder resistance and the peel strength, are those determined with respect to the substrate left after removal of the copper foil by etching.

The glass fiber length shown in Table 1 is the value determined by the microscopic and naked eye observation of the ash left after burning of the molded board. From the data of the glass fiber length, it is seen that in each of the molded boards (A), (B), (C) and (D), the glass fiber was contained in the molded board while retaining its original length, but in each of the molded boards (E) and (F) prepared through extrusion and injection molding, the glass fiber was cut into a length shorter than 0.3 mm.

From the results shown in Table 1, it is seen that when the length of the glass fiber is smaller than 5 mm [molded boards (B), (E) and (F)], the solder resistance and heat resistance are poor and the flexural strength is extremely low, whereas in the printed circuit board of the present invention [molded boards (A), (C) and (D)], these defects are eliminated.

TABLE 1

| Run No. | Molded Board | Glass Fiber Content[a] (% by weight) | Glass Fiber Length[b] (mm) | Degree of Crystallinity[c] (%) | Heat Distortion Temperature[d] (°C.) | Solder Resistance[e] | Flexural Strength[f] (kg/mm²) | Peel Strength[g] (kg/cm) |
|---|---|---|---|---|---|---|---|---|
| 1 (comparison) | (B) | 40 | 3 | 51 | 258 | Blistered | 13 | 1.6 |
| 2 (comparison) | (E) | 41 | Below 0.3 | 53 | 245 | Extremely warped | 12 | 1.5 |
| 3 (comparison) | (F) | 40 | Below 0.3 | 52 | 246 | Extremely warped | 11 | 1.6 |
| 4 (present invention) | (C) | 40 | 6 | 52 | 280 | Good | 20 | 1.6 |
| 5 (present invention) | (D) | 40 | 15 | 54 | 280 | Good | 23 | 1.7 |
| 6 (present invention | (A) | 39 | Continuous filament | 53 | 281 | Good | 20 | 1.6 |

Note
[a] determined from ash content
[b] determined by microscopic and naked eye observation of ash
[c] determined by using X-ray diffractometer (Model D-3F supplied by Rigaku Denki K.K.) and CuKα (33 KV, 12 mA, Ni filter)
[d] determined under load of 18.6 kg/cm² according to ASTM D-648
[e] evaluated by change of appearance after 30 seconds' dipping in soldering bath at 260° C.
[f] determined according to ASTM D-790
[g] determined according to JIS C-6481 and 30 parts of a bisphenol type epoxy resin in a mixed solvent of monochlorobenzene and methanol was coated and dried on a commercially available electrolytic copper foil for a printed circuit (35 mm in thickness) to form an adhesive-coated copper foil.

The so-prepared adhesive-coated copper foil was superposed on the above-mentioned molded board, and the assembly was compressed at 130° C. to thermally cure the adhesive and obtain a copper clad laminate (printed circuit board). The properties of the so-obtained copper clad laminate were determined according to JIS C-6481. The obtained results are shown in Table 1.

For comparison, the powdery PPS obtained according to the above-mentioned method was mixed with 40% by weight of a chopped glass fiber having a length of 3 or 9 mm, and the mixture was homogeneously blended by an extruder. The obtained pellet was supplied to an injection molding machine where the pellet was molded at a mold temperature of 120° C. to obtain a molded board (E) or (F) having a size of 1.6 mm × 160 mm × 120 mm. A copper clad laminate was prepared from the so-obtained molded board in the same manner

EXAMPLE 2

One to three PPS extruded sheets prepared in the same manner as described in Example 1, one to four continuous glass filament mats and one copper foil were superposed one upon another so that the copper foil was located as the outermost layer and directly contacted with a PPS sheet and the glass fiber content was as indicated in Table 2. The assembly was supplied into a flat mold die maintained at room temperature, and the mold was placed in a heating press maintained at 330° C. under a pressure of 10 kg/cm² for 15 minutes. Then, the mold was transferred to a cooling press maintained at 150° C. and was cooled under a pressure of 100 kg/cm² for 10 minutes to obtain a copper clad laminate (printed circuit board) having a thickness of 1.2 to 1.5 mm and a good appearance. The properties of the laminated board were determined in the same manner as described in Example 1. The obtained results are shown in Table 2.

From the results shown in Table 2, it is seen that in the printed circuit board of the present invention (Runs Nos. 8 and 9), good properties were obtained even without using an adhesive, whereas if the glass fiber content was lower than 15% by weight (Run No. 7), the heat resistance and flexural strength were drastically reduced.

to obtain a copper clad laminate having a thickness of 2.0 mm and comprising an insulating substrate of glass fiber-reinforced PPS. The molding conditions were as follows.

TABLE 2

| Run No. | Glass Fiber Content (% by weight) | Glass Fiber Length (mm) | Degree of Crystallinity (%) | Heat Resistance Heat Distortion Temperature (°C.) | Heat Resistance Solder Resistance | Flexural Strength (kg/mm²) | Peel Strength (kg/cm) |
|---|---|---|---|---|---|---|---|
| 7 (comparison) | 9.5 | Continuous filament | 55 | 245 | Warped and blistered | 9.5 | 1.6 |
| 8 (present invention) | 17 | Continous filament | 54 | 263 | Good | 12 | 1.7 |
| 9 (present invention) | 30 | Continuous filament | 53 | 280 | Good | 15 | 1.5 |
| 10 (present invention) | 38 | Continous filament | 53 | 281 | Good | 19 | 1.5 |

EXAMPLE 3

A sheet having a thickness of 1.0 mm was prepared from the powdery PPS obtained in Example 1 according to the extrusion method. Two of the so-prepared sheets and two of the same continuous glass filament mats as used in Example 1 were alternately superposed one upon another, and the procedures of Example 2 were repeated in the same manner except that the cooling press temperature was varied to a temperature ranging from a water-cooling temperature (i.e., about 20° C.) to 200° C., to obtain a copper clad laminate (printed circuit board) having a degree of crystallinity shown in Table 3 and a thickness of 2.0 mm. The heat resistance and flexural strength and other properties were determined to obtain results shown in Table 3.

From the results shown in Table 3, it is seen that when the degree of crystallinity was lower than 40% (Runs Nos. 11 and 12), the heat resistance was extremely reduced.

Heating zone temperature: 325° C.
Cooling zone temperature: 120° C.
Belt travelling speed: 0.33 m/min
Maximum temperature of central portion of product: 298° C.
Temperature at withdrawal of product: 180° C.

In the obtained copper clad laminate (printed circuit board), the glass fiber content in the insulating substrate was 37% by weight, the degree of crystallinity was 57%, the heat distortion temperature was 280° C. and the flexural strength was 21 kg/mm². Thus, it was confirmed that the laminate was excellent in heat resistance and mechanical properties. Furthermore, other characteristics of the laminate were determined according to JIS (Japanese Industrial Standard) C-6481 to obtain results shown in Table 4.

TABLE 4

| Item | Treatment | Characteristic Value |
|---|---|---|

TABLE 3

| Run No. | Glass Fiber Content (% by weight) | Glass Fiber Length (mm) | Cooling Press Temperature (°C.) | Degree of Crystallinity (%) | Heat Distortion Temperature (°C.) | Solder Resistance | Naked Eye Observation[a] | Flexural Strength (kg/mm²) | Peel Strength (kg/cm) |
|---|---|---|---|---|---|---|---|---|---|
| 11 (comparison) | 30 | Continuous filament | Water cooling | 5 | 162 | Extremely warped | Extremely warped | 14 | 2.0 |
| 12 (comparison) | 30 | Continuous filament | 80 | 9 | 204 | Warped and blistered | Warped | 18 | 2.1 |
| 13 (present invention) | 30 | Continuous filament | 130 | 41 | 278 | Good | No change | 15 | 1.8 |
| 14 (present invention) | 30 | Continuous filament | 160 | 55 | 278 | Good | No change | 15 | 1.5 |
| 15 (present invention) | 30 | Continuous filament | 200 | 60 | 280 | Good | No change | 16 | 1.6 |

Note
[a]Sample was maintained at 130° C. for 30 minutes and thereafter appearance was observed by naked eye (other properties were determined in the same manner as in Table 1).

EXAMPLE 4

Powdery PPS having an apparent melt viscosity of about 4,000 poises ("RYTON P-4" supplied by Phillips Petroleum Co.) was uniformly scattered on continuous glass filament mats ("M9600" supplied by Asahi Fiber Glass K.K.; basis weight=600 g/m²), and two of these glass filament mats were superposed one upon another and a copper foil having a thickness of 35μ was further superposed as an outermost layer on the mats. The assembly was supplied into a pair of endless metal belts and was continuously heated and cooled under pressure

| | | |
|---|---|---|
| Adhesion (kg/cm) | A | 1.8 |
| Solder resistance (260° C., seconds) | A | More than 30 |
| Surface resistivity (Ω) | C-96/25/65 + C-96/40/90 | 5 × 10¹⁴ |
| Chemical resistance Trichloroethylene | Boiled, 5 minutes | No change |
| Methylene chloride | Room temperature, 10 minutes | " |
| MEK | Room temperature, 10 minutes | " |
| Methanol | Room temperature, 10 minutes | " |
| Hydrochloric acid (10%) | Room temperature, | " |

TABLE 4-continued

| Item | Treatment | Characteristic Value |
|---|---|---|
| Potassium cyanide (10%) | 10 minutes 70° C., 30 minutes | Less than 10%* |

*percent of reduction of adhesion

EXAMPLE 5

The same powdery PPS as used in Example 4 was uniformly scattered on glass cloths ("H252" supplied by Asahi Fiber Glass K.K.), and two of these cloths were superposed one upon another and placed in a flat die mold in a heating press maintained at 330° C. The assembly was pressed under a pressure of 5 kg/cm² at that temperature for 3 minutes. Then, the mold was transferred into a cooling press maintained at 150° C., and the pressed assembly was cooled for 5 minutes under a pressure of 35 kg/cm² to obtain a glass cloth-reinforced molded board having a thickness of 0.65 mm.

An electrolytic copper foil for a printed circuit (35μ in thickness) was superposed on one surface of the so-obtained molded board and the laminate was supplied in a flat die mold placed in a heating press maintained at 310° C., where the laminate was pressed for 3 minutes under a pressure of 10 kg/cm². The mold was transferred into a cooling press maintained at 150° C. and the pressed laminate was cooled for 10 minutes under a pressure of 100 kg/cm².

The properties of the resulting copper clad laminate were determined to obtain results shown in Table 5.

TABLE 5

| Item | Treatment | Characteristic Value |
|---|---|---|
| Adhesion (kg/cm) | A | 1.9 |
| Solder resistance (260° C., seconds) | A | More than 30 |
| Surface resistivity (Ω) | C-96/25/65 + C-96/40/90 | 7 × 10¹⁴ |
| Chemical resistance | | |
| Trichloroethylene | Boiled, 5 minutes | No change |
| Methylene chloride | Room temperature, 10 minutes | " |
| MEK | Room temperature, 10 minutes | " |
| Methanol | Room temperature, 10 minutes | " |
| Hydrochloric acid (10%) | Room temperature, 10 minutes | " |
| Potassium cyanide (10%) | 70° C., 30 minutes | Less than 10%* |

*percent of reduction of adhesion

We claim:

1. A reinforced polyphenylene sulfide molded board comprising 20 to 85% by weight of polyphenylene sulfide and 15 to 80% by weight of glass fibers having a length of at least 5 mm.

2. A reinforced polyphenylene sulfide molded board as set forth in claim 1, wherein the glass fibers are chopped glass fibers.

3. A reinforced polyphenylene sulfide molded board as set forth in claim 1, wherein the glass fibers are in the form of a mat.

4. A reinforced polyphenylene sulfide molded board as set forth in claim 1, wherein the glass fibers are in the form of a woven fabric.

5. A reinforced polyphenylene sulfide molded board as set forth in claim 1, wherein the glass fibers are in the form of a knitted fabric.

6. A reinforced polyphenylene sulfide molded board as set forth in any of claims 1 through 5, wherein the content of the glass fibers is 20 to 75% by weight.

7. A reinforced polyphenylene sulfide molded board as set forth in any of claims 1 through 5, wherein the degree of crystallinity of the polyphenylene sulfide is at least 40%.

8. A printed circuit board comprising as an insulating substrate a reinforced polyphenylene sulfide molded board comprising 20 to 85% by weight of polyphenylene sulfide having a degree of crystallinity of at least 40% and 15 to 80% by weight of glass fibers having a length of at least 5 mm, and a metallic foil bonded to the surface of the substrate.

9. A printed circuit board as set forth in claim 8, wherein the glass fibers are chopped glass fibers.

10. A printed circuit board as set forth in claim 8, wherein the glass fibers are in the form of a mat.

11. A printed circuit board as set forth in claim 8, wherein the glass fibers are in the form of a woven fabric.

12. A printed circuit board as set forth in claim 8, wherein the glass fibers are in the form of a knitted fabric.

13. A printed circuit board as set forth in any of claims 8 through 12, wherein the content of the glass fibers is 20 to 75% by weight.

14. A printed circuit board as set forth in any of claims 8 through 12, wherein the degree of crystallinity of polyphenylene sulfide is at least 50%.

15. A process for the preparation of printed circuit boards, which comprises compressing under heating a mixture or laminate comprising 20 to 85% by weight of polyphenylene sulfide and 15 to 80% by weight of glass fibers having a length of at least 5 mm to form a composite molded board, and, at or after the compression step, bonding a metallic foil to a surface of the molded board.

16. A process for the preparation of printed circuit boards according to claim 15, wherein the polyphenylene sulfide/glass fiber mixing ratio is in the range of from 25/75 to 80/20 by weight.

17. A process for the preparation of printed circuit boards according to claim 15, wherein a mixture of powdery polyphenylene sulfide and chopped glass fibers is placed into a mold where the mixture is compressed under heating to be thereby integrated.

18. A process for the preparation of printed circuit boards according to claim 15, wherein a laminate comprising chopped glass fibers interposed between polyphenylene sulfide sheets is placed in a mold where the laminate is compressed under heating to be thereby integrated.

19. A process for the preparation of printed circuit boards according to claim 15, wherein powdery polyphenylene sulfide is uniformly scattered on a mat, woven fabric or knitted fabric of glass fibers, and the mat, woven fabric or knitted fabric is placed in a mold where the mat or woven or knitted fabric is compressed under heating to be thereby integrated.

20. A process for the preparation of printed circuit boards according to claim 15, wherein a laminate comprising one or more mats, woven fabrics or knitted fabrics of glass fibers and one or more polyphenylene sulfide sheets is compressed in a mold under heating to be thereby integrated.

21. A process for the preparation of printed circuit boards according to claim 15, wherein the mixture or laminate of the polyphenylene sulfide and the glass fibers is placed between a pair of metal belts and is continuously heated under application of a pressure to effect the integration.

22. A process for the preparation of printed circuit boards according to any of claims 17 through 21, wherein the metallic foil is bonded to the surface of the molded board simultaneously with the compression under heating.

23. A process for the preparation of printed circuit boards according to any of claims 17 through 21, wherein the metallic foil is bonded to the surface of the molded board after the compression under heating.

24. A process for the preparation of printed circuit boards according to any of claims 15 through 21, wherein the heating temperature is higher than the melting point of polyphenylene sulfide.

* * * * *